United States Patent
Uchikawa et al.

(10) Patent No.: US 8,332,726 B2
(45) Date of Patent: Dec. 11, 2012

(54) NON-VOLATILE SEMICONDUCTOR MEMORY DEVICE

(75) Inventors: Hironori Uchikawa, Yokohama (JP); Tatsuyuki Ishikawa, Yokohama (JP); Mitsuaki Honma, Yokohama (KP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/310,003

(22) Filed: Dec. 2, 2011

(65) Prior Publication Data

US 2012/0079354 A1    Mar. 29, 2012

Related U.S. Application Data

(63) Continuation of application No. 11/877,287, filed on Oct. 23, 2007, now Pat. No. 8,078,940.

(30) Foreign Application Priority Data

Oct. 25, 2006  (JP) ................................ 2006-289974

(51) Int. Cl.
    *G11C 29/00* (2006.01)
(52) U.S. Cl. ................................... 714/764; 365/185.24
(58) Field of Classification Search ............. 365/185.02, 365/185.24; 714/702, 763, 764
    See application file for complete search history.

(56) References Cited

U.S. PATENT DOCUMENTS

| | | | |
|---|---|---|---|
| 5,657,332 A | 8/1997 | Auclair et al. | |
| 6,963,505 B2 | 11/2005 | Cohen | |
| 6,992,932 B2 | 1/2006 | Cohen | |
| 7,242,618 B2 | 7/2007 | Shappir et al. | |
| 7,257,025 B2 | 8/2007 | Maayan et al. | |
| 7,447,950 B2 * | 11/2008 | Takahashi et al. | ............. 714/702 |
| 7,457,155 B2 * | 11/2008 | Nazarian | .................. 365/185.02 |
| 7,535,765 B2 | 5/2009 | Maayan | |
| 7,757,153 B2 * | 7/2010 | Hwang et al. | .................. 714/763 |
| 8,156,403 B2 | 4/2012 | Shalvi et al. | |
| 2005/0013165 A1 | 1/2005 | Ban | |
| 2007/0070696 A1 | 3/2007 | Avraham et al. | |

FOREIGN PATENT DOCUMENTS

| | | |
|---|---|---|
| JP | 2000-268593 | 9/2000 |
| JP | 2003-134091 | 5/2003 |
| JP | 2005-078721 | 3/2005 |
| JP | 2008-016092 | 1/2008 |

OTHER PUBLICATIONS

Office Action issued Nov. 15, 2011, in Japanese Patent Application No. 2006-289974, (with English-language Translation).

Office Action issued May 1, 2012 in Japanese Application No. 2006-289974, (with English translation).

* cited by examiner

*Primary Examiner* — David Ton

(74) *Attorney, Agent, or Firm* — Oblon, Spivak, McClelland, Maier & Neustadt, L.L.P.

(57) ABSTRACT

A non-volatile semiconductor memory device comprises a memory cell array including a plurality of memory cells arrayed capable of storing information in accordance with variations in threshold voltage. A likelihood calculator has a plurality of likelihood calculation algorithms for deriving a likelihood value about a stored data bit from a threshold value read out of the memory cell. An error correction unit executes error correction through iterative processing using the likelihood value obtained at the likelihood calculator. A likelihood calculator controller changes among the likelihood calculation algorithms in the likelihood calculator based on a certain value of the number of iterations in the iterative processing obtained from the error correction unit.

20 Claims, 14 Drawing Sheets

NON-VOLATILE SEMICONDUCTOR MEMORY DEVICE

CROSS-REFERENCE TO RELATED APPLICATION

This application is a continuation application of U.S. application Ser. No. 11/877,287, and claims the benefit of priority from Japanese Patent Application No. 2006-289974, filed on Oct. 25, 2006, the entire contents of which are incorporated herein by reference.

BACKGROUND OF THE INVENTION

1. Field of the Invention

The present invention relates to a non-volatile semiconductor memory device, and more particularly to a non-volatile semiconductor memory device with reduced errors on reading information stored in a flash memory.

2. Description of the Related Art

Known non-volatile semiconductor memory devices include an NAND cell-type flash memory. The NAND cell-type flash memory comprises a memory cell array including a plurality of NAND cell units. An NAND cell unit includes a plurality of memory cells serially connected, and two selection transistors connected to both ends thereof. A memory cell in an erased state holds "1"-data with a negative threshold voltage. At the time of data write, electrons are injected into a floating gate, thereby rewriting the data "0" with a positive threshold voltage. The NAND cell-type flash memory is only capable of shifting the threshold voltage from a lower one to a higher one at the time of data write. The reverse shift (from a higher threshold voltage to a lower one) can be executed only in an erase operation on a block basis.

In general, the NAND cell-type flash memory exhibits variations in the oxide film contained in memory cells on a memory cell basis and causes a distribution of threshold voltages at the time of write. In order to prevent failed information read at the time of read, therefore, threshold voltage levels are so set as to prevent overlapping threshold distributions. In the NAND cell-type flash memory, however, leakage of charge from the floating gate due to a variation over time, and deterioration of the oxide film due to iterative write and erase operations in the memory cell may vary and extend the threshold distributions to cause failed information read.

U.S. Pat. No. 5,657,332 discloses, for handling this problem, a method of changing a threshold voltage level for read at the time of occurrence of a read error, that is, failed information read, and executing another read operation.

SUMMARY OF THE INVENTION

In one aspect the present invention provides a non-volatile semiconductor memory device, comprising: a memory cell array including a plurality of memory cells arrayed capable of storing information in accordance with variations in threshold voltage; a likelihood calculator having a plurality of likelihood calculation algorithms for deriving a likelihood value about a stored data bit from a quantized value of the threshold voltage read out of the memory cell; an error correction unit configured to execute error correction through iterative processing using the likelihood value obtained at the likelihood calculator; and a likelihood calculator controller configured to change among the likelihood calculation algorithms in the likelihood calculator based on a certain value of the number of iterations in the iterative processing obtained from the error correction unit.

In one aspect the present invention provides a non-volatile semiconductor memory device, comprising: a memory cell array including a plurality of memory cells arrayed capable of storing information in accordance with variations in threshold voltage; a likelihood calculator having a plurality of likelihood calculation algorithms for deriving a likelihood value about a stored data bit from a quantized value of the threshold voltage read out of the memory cell; an error correction unit configured to execute error correction through iterative processing using the likelihood value obtained at the likelihood calculator; and a likelihood calculator controller configured to change among the likelihood calculation algorithms in the likelihood calculator based on a certain value of the number of errors corrected in the error correction unit.

In one aspect the present invention provides a non-volatile semiconductor memory device, comprising: a memory cell array including a plurality of memory cells arrayed capable of storing information in accordance with variations in threshold voltage; a likelihood calculator having a plurality of likelihood calculation algorithms for deriving a likelihood value about a stored data bit from a quantized value of the threshold voltage read out of the memory cell; an error correction unit configured to execute error correction through iterative processing using the likelihood value obtained at the likelihood calculator; a rewrite controller operative to measure and store the number of rewrite operations executed at each address in the memory cell array; and a likelihood calculator controller configured to change among the likelihood calculation algorithms in the likelihood calculator based on a certain value of the number of rewrite operations stored in the rewrite controller.

In one aspect the present invention provides a non-volatile semiconductor memory device, comprising: a memory cell array including a plurality of memory cells arrayed capable of storing information in accordance with variations in threshold voltage; a likelihood calculator having a plurality of likelihood calculation algorithms for deriving a likelihood value about a stored data bit from a quantized value of the threshold voltage read out of the memory cell; an error correction unit configured to execute error correction through iterative processing using the likelihood value obtained at the likelihood calculator; a memory cell information storage unit operative to store the characteristic of a memory cell at each address in the memory cell array; and a likelihood calculator controller configured to read the characteristic information stored in the information storage unit based on address information about the read-executed memory cell and set a likelihood calculation algorithm based on the characteristic information.

In one aspect the present invention provides a non-volatile semiconductor memory device, comprising: a memory cell array including a plurality of memory cells arrayed capable of storing information in accordance with variations in threshold voltage; a likelihood calculator having a plurality of likelihood calculation algorithms for deriving a likelihood value about a stored data bit from a quantized value of the threshold voltage read out of the memory cell; an error correction unit configured to execute error correction through iterative processing using the likelihood value obtained at the likelihood calculator; and a likelihood calculator controller configured to change among the likelihood calculation algorithms in the likelihood calculator; wherein the memory cell includes pilot memory cells in which a threshold voltage to be programmed is determined in advance per address, and the likelihood calculator controller changes among the likelihood calculation algorithms based on a quantized value of the threshold voltage read out from the pilot memory cell.

DETAILED DESCRIPTION OF THE EMBODIMENTS

[Process to Reach the Present Invention]

Figure 1:
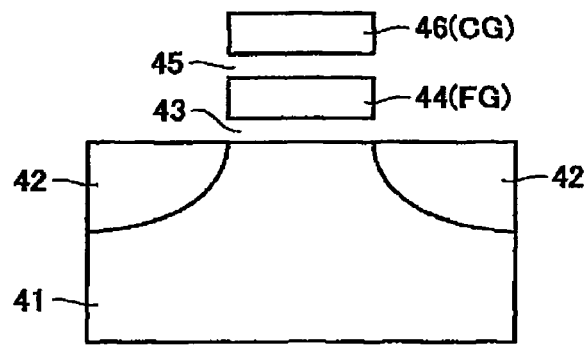
FIG. 1 is a cross-sectional view of a memory cell MC in the present embodiment.
Figure 2:
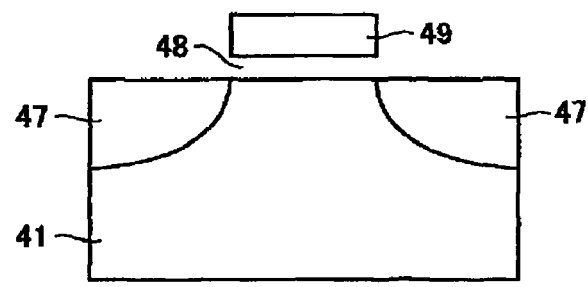
FIG. 2 is a cross-sectional view of selection gates S1, S2 in the present embodiment.

FIGS. 1 and 2 show a memory cell MC and selection gates S1 and S2 in an NAND-type flash memory in section according to the embodiment of the present invention. A substrate 41 is provided to form an n-type, diffused layer 42, which serves as a source and a drain of a MOSFET contained in the memory cell MC. A floating gate (FG) 44 is formed on the substrate 41 with a gate insulator 43 interposed therebetween, and a control gate (CG) 46 is formed on the floating gate 44 with an insulator 45 interposed therebetween.

The selection gate S1, S2 includes the substrate 41, and an n-type, diffused layer 47 formed in the substrate 41 to serve as a source and a drain. A control gate 49 is formed on the substrate 41 with a gate insulator 48 interposed therebetween.

Figure 3:
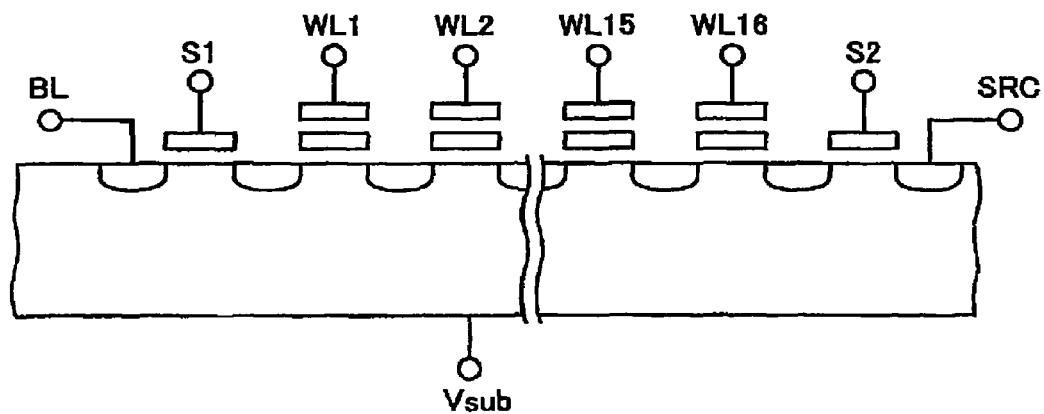
FIG. 3 is a cross-sectional view of one NAND cell in a memory cell array in the present embodiment.

FIG. 3 shows one NAND cell in a memory cell array in section according to the embodiment of the present invention. One NAND cell includes 16 serially connected memory cells MC each configured as shown in FIG. 1. The NAND cell is structured such that the first selection gate S1 and the second selection gate S2, each configured as shown in FIG. 2, are provided on the drain side and the source side.

For such the NAND cell-type flash memory comprising the NAND cell, existing systems for enhanced error correction through decoding iterations using soft decision information employ a LDPC (low density parity check) code and a turbo code.

Application of these error correction systems to the NAND cell-type flash memory requires acquiring more accurate threshold levels from the memory cell than hard decision and calculating a likelihood value per stored page data. Namely, plural different threshold voltages are required to read data for calculating the likelihood value. The likelihood value is a value representative of the likelihood of each bit information. It is also referred to as a log-likelihood ratio in the present invention, which represents a logarithmic value of the ratio of the probability of data "0" to the probability of data "1".

The likelihood value may be obtained by conducting a probability-calculation concerning quantized value of the threshold voltage read out of memory cells. The quantized value of the threshold voltage indicates that to what range the threshold voltage belongs. The calculation of the likelihood value is highly dependent of the threshold voltage distribution. Therefore, the threshold distribution may be changed from that used for a probability calculation due to the variation over time or deterioration of the gate oxide. In this case, the likelihood value cannot be calculated accurately, and thus error correction cannot be executed properly.

Figure 4A:
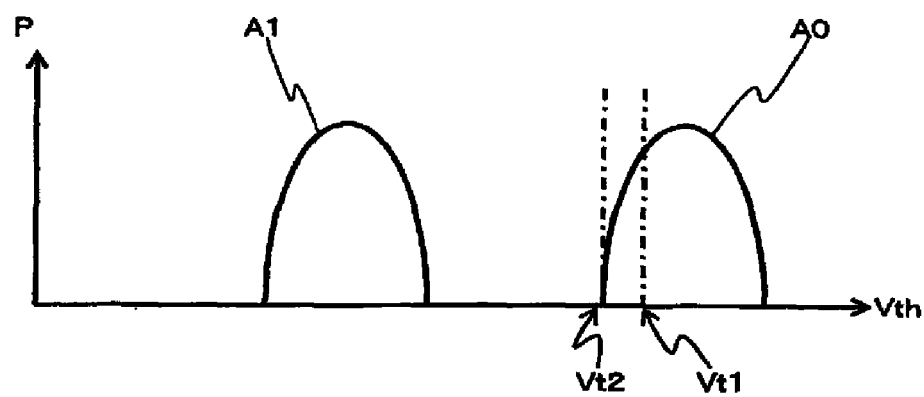
FIG. 4A and FIG. 4B each shows characteristic diagrams of threshold voltage distributions in an NAND cell-type flash memory.
Figure 4B:
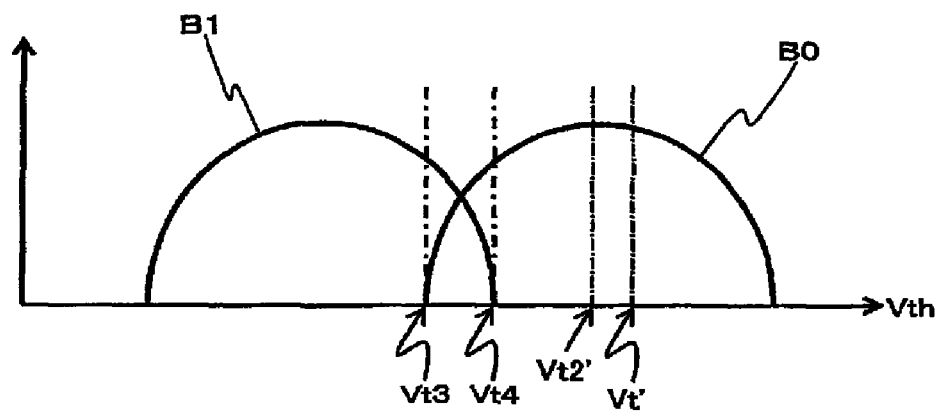

FIG. 4A shows the threshold voltage distributions including a distribution A0 for data "0", and a distribution A1 for data "1". In this case, a read operation with read voltages Vt1 and Vt2 may determine a first likelihood value of a memory cell indicating a probability of data "0" being 30 [%] and a probability of data "1" being 0 [%].

However, the threshold voltage distributions may be changed to include a distribution B0 for data "0" and a distribution B1 for data "1", due to the variation over time including deterioration of the oxide or the like. The distributions B0 and B1 overlap each other. Accordingly, even if a read operations with read voltages Vt1' and Vt2' is performed, similar to FIG. 4A, the likelihood value obtained is different from the first likelihood value. Otherwise, even if read threshold voltages are changed to Vt3 and Vt4 so that a probability of data "1" is 30 [%], the likelihood value obtained indicates that the probability of data "1" is 30 [%] and the probability of data "0" is 30 [%], which is different from the first likelihood value.

As described, in the NAND cell-type flash memory, the variation over time including deterioration of the oxide or the like varies the threshold voltage distribution. When the threshold voltage distribution varies, the likelihood value cannot be calculated properly. As a result, error correction cannot be executed sufficiently. The following embodiments include an example of configurations for solving such the problem.

First Embodiment

An embodiment in the present invention is described below.

Figure 5:
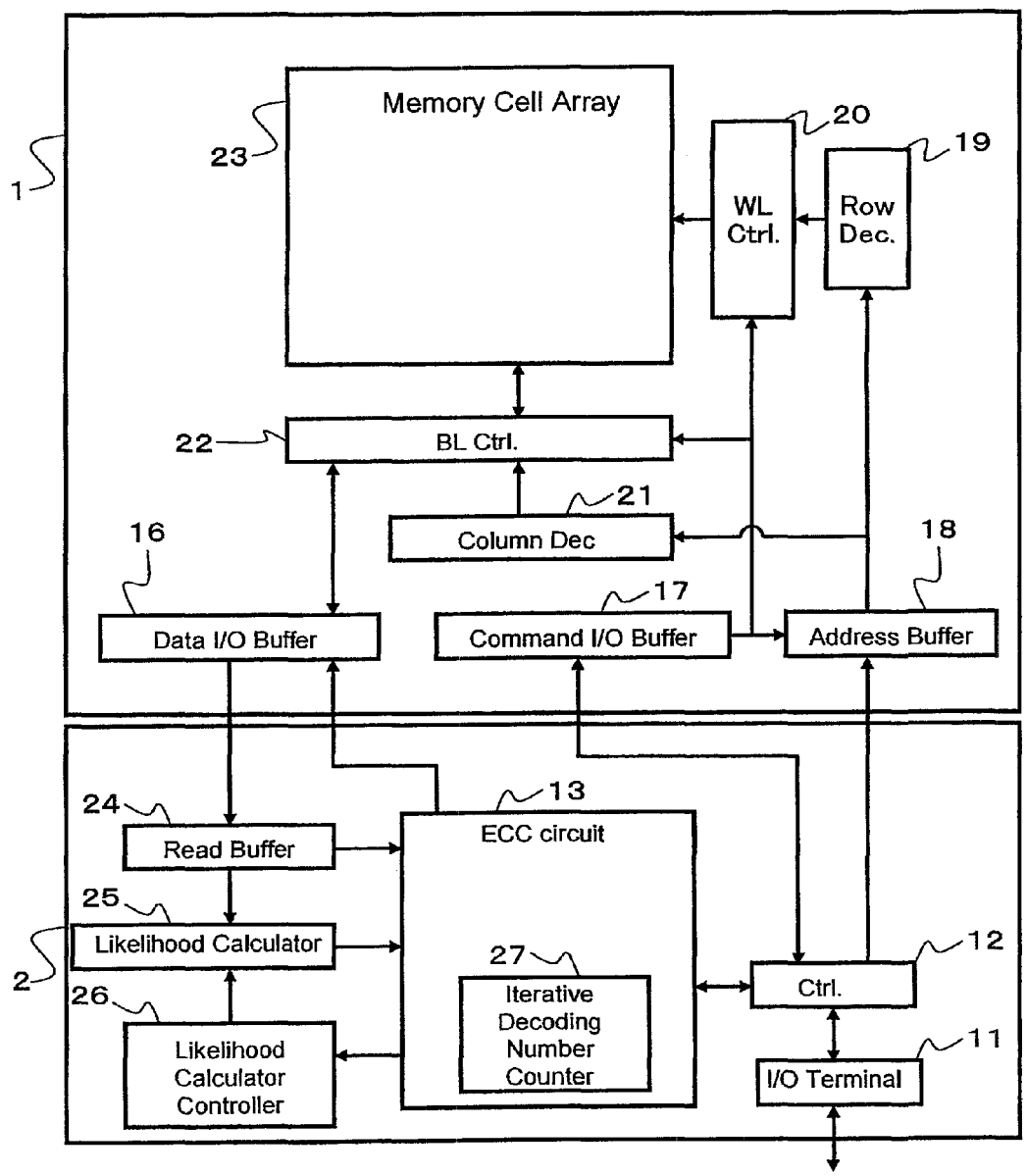
FIG. 5 is a block diagram of a non-volatile semiconductor memory device in a first embodiment.

FIG. 5 is a block diagram of an NAND cell-type flash memory, which is a non-volatile semiconductor memory device in the present embodiment.

The NAND cell-type flash memory in the present embodiment comprises a memory section 1, and a control section 2 for controlling the memory section 1.

The memory section 1 includes a data I/O buffer 16, a command input buffer 17, an address buffer 18, a row decoder 19, a word line controller 20, a column decoder 21, a bit line controller 22, and a memory cell array 23.

The memory cell array 23 includes memory cells arrayed in matrix for data storage. Namely, the memory cell array 23 includes a plurality of bit lines, a plurality of word lines and a common source line, and electrically erasable programmable memory cells are arrayed in matrix at intersections of the bit lines and the word lines. A memory cell is used to store frame data, which includes input data, and parity data (redundant data) for error correction added to the input data at every certain data bits.

The memory cell array 23 is connected to the word line controller 20 configured to control the word line voltage, and to the bit line controller 22. The word line controller 20 selects a word line in accordance with an address signal decoded at the row decoder 19 and controls the word line voltage. The row decoder 19 receives signals from a control circuit 12 in the control section 2 via the address buffer 18.

The bit line controller 22 is a sense amp and data latch circuit, which has a function of sensing/amplifying a signal based on data from a memory cell in the memory cell array 23 via the bit line as well as a data latch function of holding read data or write data.

The bit line controller 22 is connected to the column decoder 21, the data I/O buffer 16 and the command I/O buffer 17. The bit line controller 22 has a function of selecting a bit line in accordance with an address signal decoded at the column decoder 21.

The data I/O buffer 16 has a function of temporarily holding I/O data to/from the bit line controller 22 to provide data to the control section 2 via the data I/O buffer 16. The data I/O buffer 16 also has a function of temporarily holding write data in the memory cell array 23 or read data from the memory cell array 23.

The command I/O buffer 17 has a function of temporarily holding a command transferred from the control circuit 12 in the control section 2 to the memory section 1. The address buffer 18 has a function of temporarily holding the address signal from the control circuit 12 in the control section 2.

The control section 2 includes an I/O terminal 11, a control circuit 12, an error correction unit or ECC circuit 13, a read buffer 24, a likelihood calculator or likelihood calculator circuit 25, and a likelihood calculator controller or likelihood calculator controller circuit 26.

The I/O terminal 11 is used to input/output a data sequence from/to external therethrough. The control circuit 12 is used to control information write and read based on the data sequence input from the I/O terminal 11.

In the present embodiment the ECC circuit 13 includes a decoding iteration counter 27. The decoding iteration counter 27 has a function of measuring the number of decoding iterations on iterative decoding in error correction.

In the present embodiment the value of the number of decoding iterations on iterative decoding in error correction is used as the reference to change among likelihood calculation algorithms. Namely, as the value of the number of decoding iterations on signal decoding increases, the likelihood value resulted from that likelihood calculation algorithm has an increased possibility of causing an error. On the basis of such the fact, a likelihood calculation algorithm is changed to another in such the case. Therefore, the ECC circuit 13 is provided with the decoding iteration counter 27 to count the number of decoding iterations on iterative decoding.

The read buffer 24 has a function of temporarily holding data output from the memory section 1 via the data I/O buffer 16.

The likelihood value calculator 25 has a function of calculating likelihood values corresponding to the multivalue-stored bits in a memory cell based on the data temporarily held in the read buffer 24. In the present embodiment the likelihood value calculator 25 is given plural likelihood calculation algorithms. The likelihood calculation algorithms have different threshold voltage distributions for use in the likelihood value calculation. At reading, one of the threshold voltage distributions is once selected and used therefor. Using a likelihood calculation algorithm calculating a likelihood value based on a threshold distribution that matches the threshold voltage distribution of the memory cells may lead to accurate calculation of the likelihood value.

The ECC circuit 13 executes error correction based on the likelihood value resulted from the selected likelihood calculation algorithm. The algorithm applied to the ECC circuit 13 may include ECC algorithms for conducting decoding by iterative decoding signal-processing such as a LDPC (low density parity check) code, a turbo code, and a RA (Repeat Accumulate) code.

In the present embodiment a binary memory is described though the present embodiment is not limited to the binary memory but rather can be applied to multi-valued storage of a power of two.

[Method of Writing]

The following description is given to a method of writing data in the non-volatile semiconductor memory device of the present embodiment.

At the time of data write, the I/O terminal 11 receives a write sequence from external and transfers it to the control circuit 12. The write sequence includes an instruction to the control circuit 12, a write address, and one page of bit data to be written. The control circuit 12 generates a write command, a write address and write data based on the write sequence and transfers them to the command I/O buffer 17, the address buffer 18 and the ECC circuit 13, respectively. The write data is additionally given parity data for error correction, which is generated corresponding to every certain data bits at a parity data adder (not shown) in the ECC circuit 13, thereby forming frame data (ECC frame). Thereafter, the frame data is transferred to the data I/O buffer 16 and the data is written via the bit line controller 22 into a memory cell at the write address in the memory cell array 23.

The write command transferred to the command I/O buffer 17 is further transferred to the address buffer 18, the word line controller 20 and the bit line controller 22. The write address transferred to the address buffer 18 is transferred to the word line controller 20 via the row decoder 19 and to the bit line controller 22 via the column decoder 21. Thus, a control can be executed to write data in the memory cell array 23.

[Method of Reading]

Data read is started when the I/O terminal 11 receives a read sequence. The read sequence received at the I/O terminal is transferred to the control circuit 12. The control circuit 12 generates a read command and a read address from the read sequence and transfers the read command to the command I/O buffer 17 and the read address to the address buffer 18. Under the control of the word line controller 20 and the bit line controller 22, with the use of the command I/O buffer 17 and the address buffer 18, data is read out of a memory cell in the memory cell array 23 at an address indicated by the read address, and is transferred to the bit line controller 22. The read data transferred to the bit line controller 22 is further transferred via the data I/O buffer 16 to the read buffer 24. The threshold level data transferred to the read buffer 24 and accumulated therein is transferred on a memory cell basis to the likelihood value calculator 25 to calculate a likelihood value of each sub-page. Thereafter, likelihood values corresponding to the ECC frame that is the unit for error correction are transferred to the ECC circuit 13 in order and used in error correction. Thereafter, the error-corrected data is transferred to the control circuit 12 and provided to external through the I/O terminal 11.

In a multi-valued memory capable of storing data of two or more bits in one memory cell, a resolution of $2^n$ or more (n denotes the number of bits) is required for the read threshold voltage levels. Specifically, in multi-valued storage, a tetranary (4-level) memory capable of storing information of two bits in one memory cell requires a resolution equal to or more than the threshold voltage levels in four states.

A flowchart of read in the present embodiment is described next based on FIG. 6.

Figure 6:
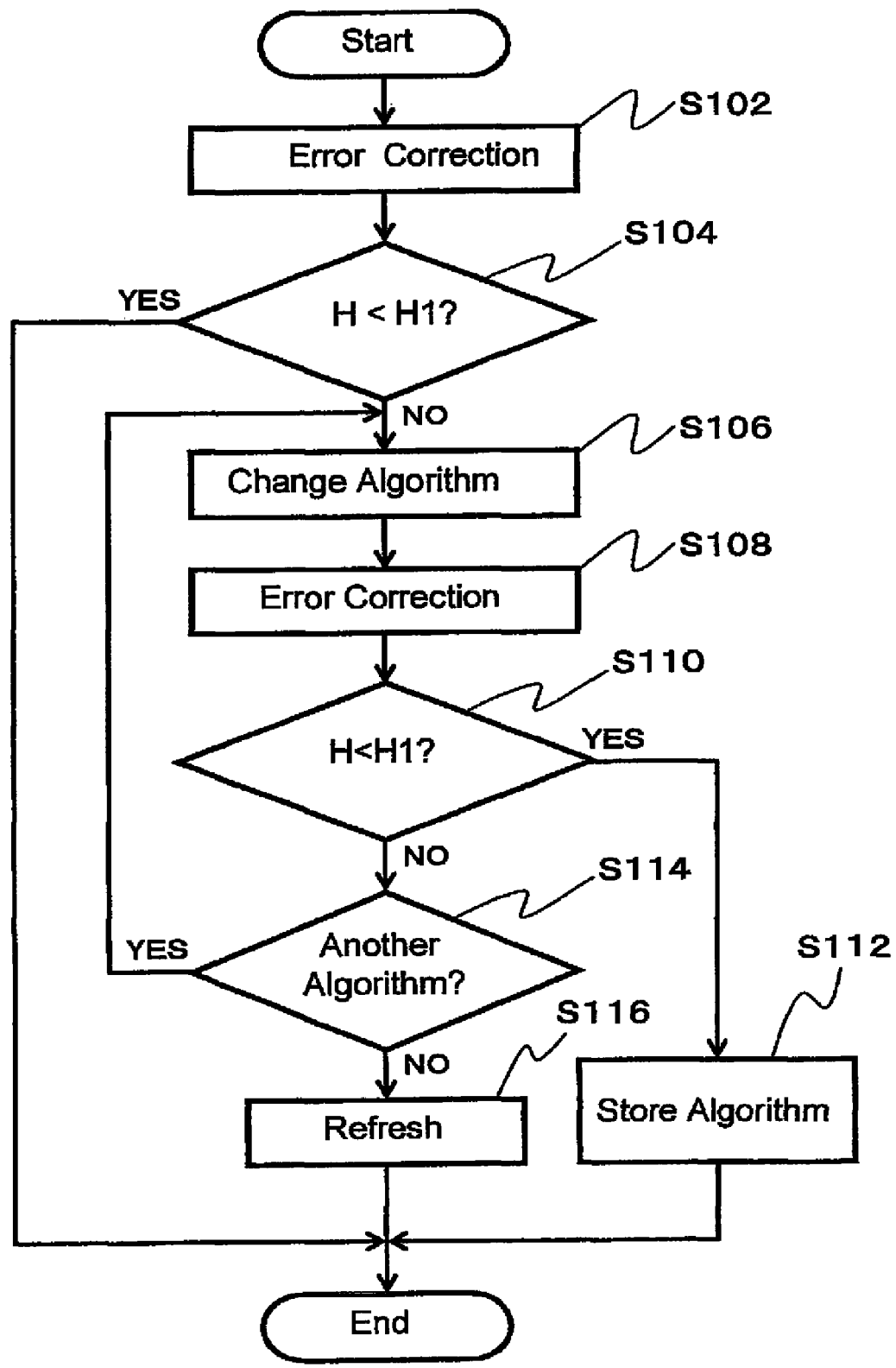
FIG. 6 is a flowchart of operation of the non-volatile semiconductor memory device in the first embodiment.

The flow shown in FIG. 6 starts after the likelihood calculator circuit 25 calculates a likelihood value from the read frame data and feeds the calculated likelihood value to the ECC circuit 13. The likelihood calculator circuit 25 in the initial stage selects and uses a likelihood calculation algorithm for calculating a likelihood value based on the threshold voltage distribution among memory cells in the initial state that exhibits no deterioration of the oxide and the like.

First, error correction is executed at the step 102 (S102). At the same time, the number H of decoding iterations in the error correction process is counted at the decoding iteration counter 27 provided in the ECC circuit 13.

Next, at the step 104 (S104), a judgment is made on whether or not the number H of decoding iterations counted at the decoding iteration counter 27 is smaller than the reference number H1. Specifically, the value of the number H of decoding iterations counted at the decoding iteration counter 27 is transmitted to the likelihood calculator controller circuit 26 and the judgment is made in the likelihood calculator controller circuit 26.

If the transmitted number H of decoding iterations is judged smaller than the reference number H1 at the step 104, the flow ends and the error-corrected data is provided via the control circuit 2 from the I/O terminal 1 to external.

If the transmitted number H of decoding iterations is judged equal to or larger than the reference number H1 at the step 104 on the other hand, the flow goes to the step 106 (S106). The reference number H1 is a value set in advance through experiments and the like. In the algorithm for soft-decision decoding such as a LDPC code, the larger the occurrences of read errors and the more inaccurate the likelihood value for use in decoding, the larger the tendency to increase the number of decoding iterations. This fact is found by the inventor et al. Therefore, the number of decoding iterations at the likelihood value obtained through a certain likelihood calculation algorithm can be used as the reference to select, among plural likelihood calculation algorithms, a likelihood calculation algorithm for use, thereby improving the decoding rate in error correction. As the reference for selection, the reference number H1 as the number of decoding iterations is used to determine whether the probability of causing errors is considerably high.

As described above, a likelihood calculation algorithm suitable for memory cells in the initial state is initially selected to calculate a likelihood value.

At the step 106 (S106), the likelihood calculation algorithm is changed to another. Specifically, the likelihood calculator controller circuit 26 selects a likelihood calculation algorithm different in threshold distribution for use in likelihood calculation and transmits an instruction to the likelihood calculator circuit 25 for likelihood calculation with the changed likelihood calculation algorithm.

Next, at the step 108 (S108), the likelihood calculator circuit 25 uses the changed likelihood calculation algorithm to calculate a likelihood value on the ECC frame again and feeds the calculated likelihood value to the ECC circuit 13.

Thereafter, the likelihood value calculated through the changed likelihood calculation algorithm is used in the ECC circuit 13 for error correction. At the same time, the number H of decoding iterations in the error correction process is counted at the decoding iteration counter 27 provided in the ECC circuit 13.

Next, at the step 110 (S110), a judgment is made on whether or not the number H of decoding iterations counted at the decoding iteration counter 27 is smaller than the reference number H1. Specifically, the value of the number H of decoding iterations counted at the decoding iteration counter 27 is transmitted to the likelihood calculator controller circuit 26.

If the transmitted number H of decoding iterations is judged smaller than the reference number H1 at the step 110, the flow goes to the step 112 (S112).

At the step 112 (S112), the likelihood calculator circuit 25 stores information on the changed likelihood calculation algorithm for the later use, and the flow ends.

On the other hand, if the transmitted number H of decoding iterations is judged equal to or larger than the reference number H1 at the step 110, the flow goes to the step 114 (S114). At the step 114 (S114), a judgment is made on whether or not the likelihood calculator circuit 25 still has other likelihood calculation algorithms that have not been used previously.

If it is judged at the step 114 that the likelihood calculator circuit 25 has other likelihood calculation algorithms, the flow jumps to the step 106. At the step 106, the likelihood calculation algorithm is changed again to a different one.

On the other hand, if it is judged at the step 114 that the likelihood calculator circuit 25 has no other likelihood calculation algorithm, the flow goes to the step 116 (S116).

At the step 116 (S116), a refresh operation is executed to the page data at the read address of the frame data. The refresh operation means an operation of writing the page data with a proper threshold voltage level, by reading page data stored at an address in the memory cell array 23 and copying it at another address, for example. If a memory cell block that is defined as the erase unit has higher correlations between threshold voltage distributions for respective pieces of page data, the refresh operation can be executed on a block basis. After the refresh operation is executed at the step 116, the flow ends.

As described above, in the present embodiment, the number of decoding iterations in error correction is used as the reference to select a likelihood calculation algorithm for calculating a likelihood value based on a threshold distribution that matches the threshold distribution of the memory cells. The selected algorithm is then used to calculate a likelihood value. Thus, it is possible to obtain the most reliable likelihood value and improve the error correction ability.

Second Embodiment

A second embodiment is configured such that the number of corrected errors on error correction is used as the reference in selection of a likelihood calculation algorithm. Therefore, a corrected-error counter 28 is provided as shown in FIG. 7, in place of the decoding iteration counter 27 provided in the ECC circuit 13 in the first embodiment.

Figure 7:
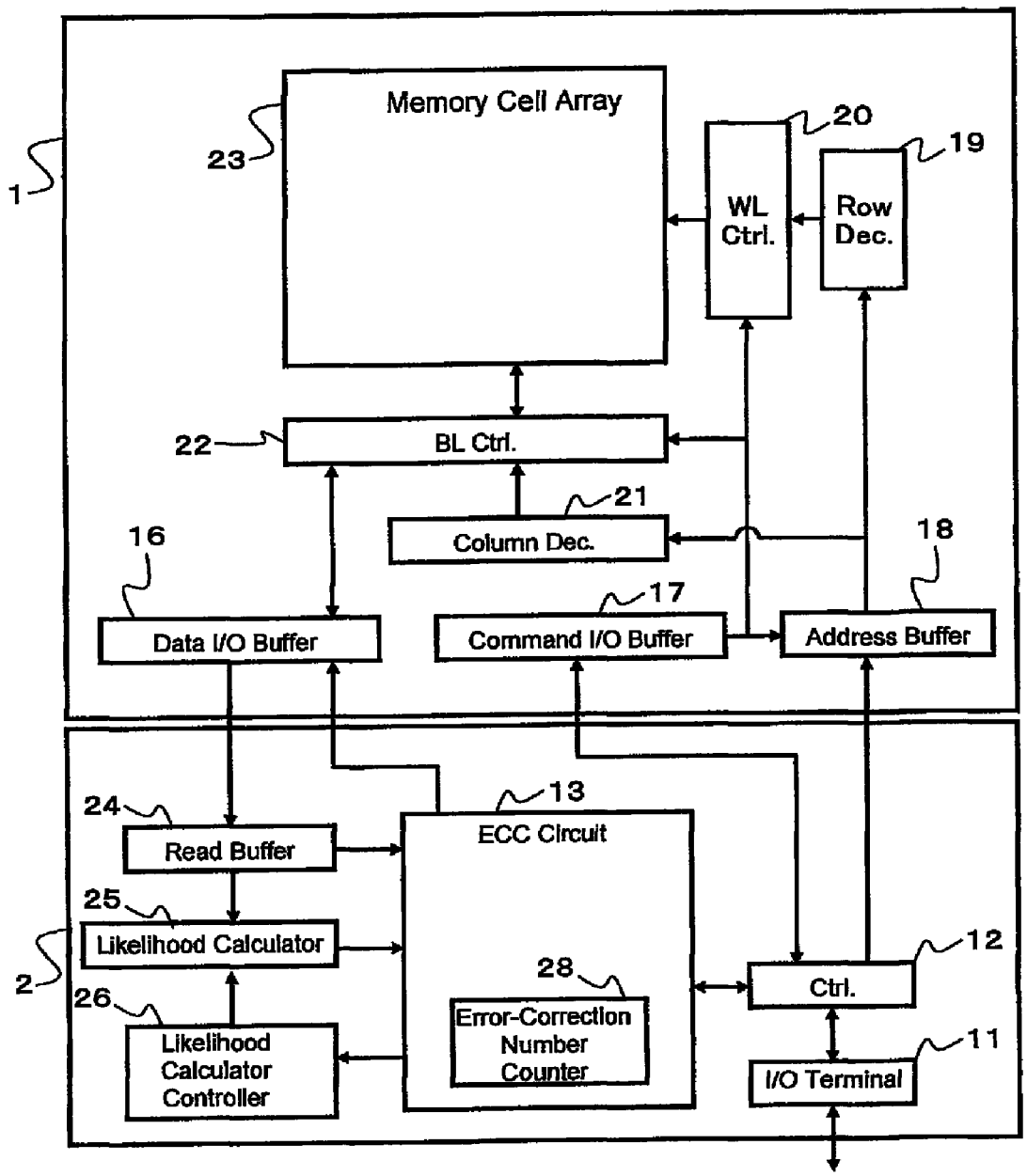
FIG. 7 is a block diagram of a non-volatile semiconductor memory device in a second embodiment.

FIG. 7 is a block diagram of an NAND cell-type flash memory, which is a non-volatile semiconductor memory device in the present embodiment.

The NAND cell-type flash memory in the present embodiment comprises a memory section 1, and a control section 2 for controlling the memory section 1.

The memory section 1 includes a data I/O buffer 16, a command input buffer 17, an address buffer 18, a row decoder 19, a word line controller 20, a column decoder 21, a bit line controller 22, and a memory cell array 23.

The control section 2 includes an I/O terminal 11, a control circuit 12, an error correction unit or ECC circuit 13, a read buffer 24, a likelihood calculator or likelihood calculator circuit 25, and a likelihood calculator controller or likelihood calculator controller circuit 26. These circuits have the same functions as those in the first embodiment.

In the present embodiment the ECC circuit 13 includes the corrected-error counter 28 as described above. The corrected-error counter 28 has a function of measuring the number of bits corrected in error correction.

In the present embodiment the value of the number of bits corrected in the ECC circuit 13 (the number of corrected errors) is used as the reference to change among likelihood calculation algorithms. Namely, the reason for increase in data error is that a threshold voltage distribution among memory cells varies from the initial threshold distribution. As the value of the number of corrected errors increases, a correct likelihood value can not be obtained with the initial likelihood calculation algorithm. Therefore, such the case requires the likelihood calculation algorithm to be changed to another. Accordingly, the ECC circuit 13 is provided with the corrected-error counter 28 therein and the corrected-error counter 28 is used to count the number of bits corrected in the ECC circuit 13.

The data writing method and others are similar to those in the first embodiment.

A flow of read in the present embodiment is described next based on FIG. 8.

Figure 8:
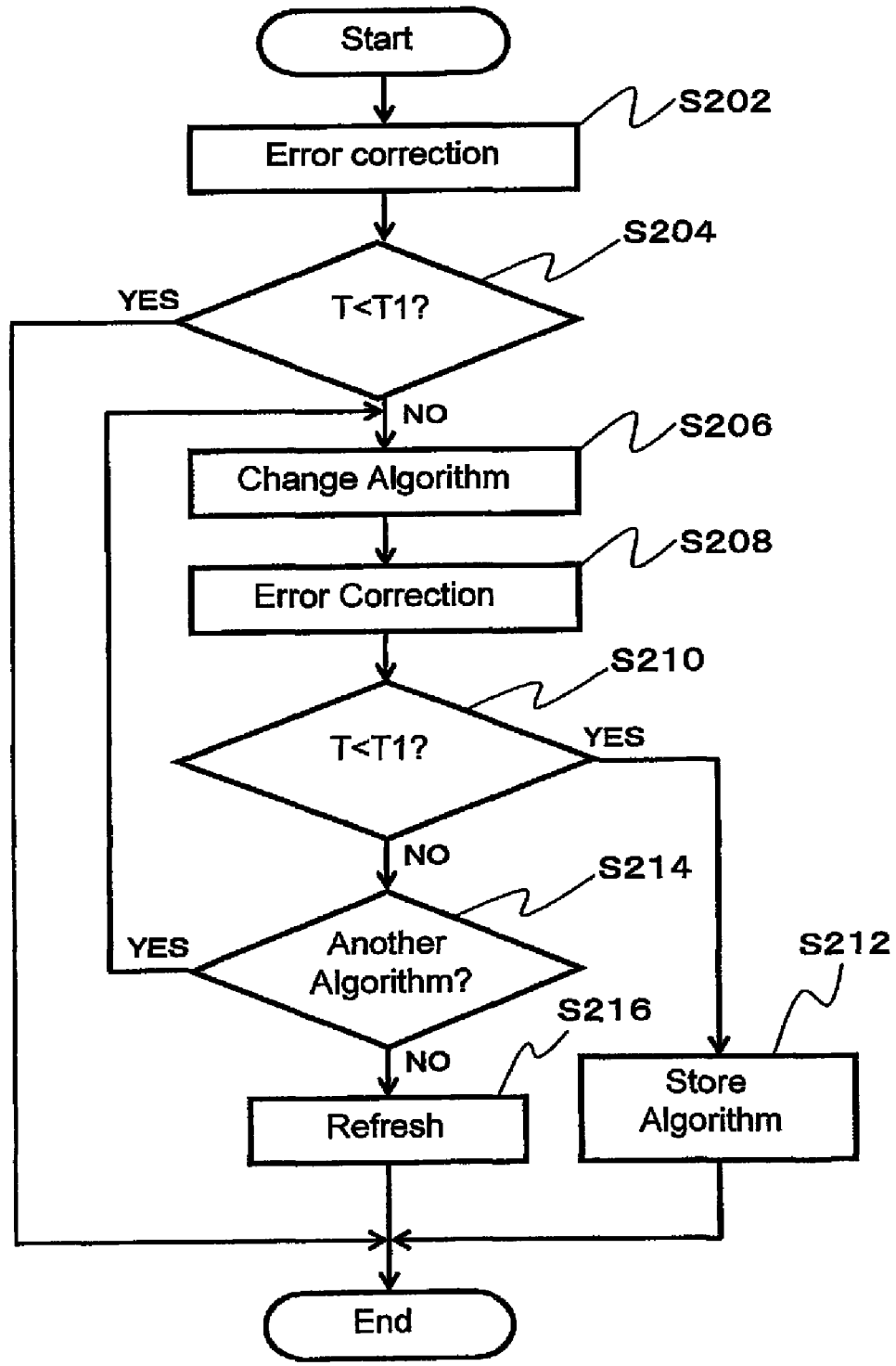
FIG. 8 is a flowchart of operation of the non-volatile semiconductor memory device in the second embodiment.

The flow shown in FIG. 8 starts after the likelihood calculator circuit 25 calculates a likelihood value from the read frame data and feeds the calculated likelihood value to the ECC circuit 13. The likelihood calculator circuit 25 in this case selects and uses a likelihood calculation algorithm suitable for correcting an error in information read out of a memory cell in the initial state that exhibits no deterioration of the oxide and the like.

First, error correction is executed at the step 202 (S202). At the same time, the number T of bits corrected in the error correction process is counted at the corrected-error counter 28 provided in the ECC circuit 13.

Next, at the step 204 (S204), a judgment is made on whether or not the number T of corrected errors counted at the corrected-error counter 28 is smaller than the reference value T1. Specifically, the value of the number T of corrected errors counted at the corrected-error counter 28 is transmitted to the likelihood calculator controller circuit 26 and a judgment is made in the likelihood calculator controller circuit 26.

If the transmitted number T of corrected errors is judged smaller than the reference value T1 at the step 204, the flow ends and the error-corrected data is provided via the control circuit 2 from the I/O terminal 1 to external.

If the transmitted number T of corrected errors is judged equal to or larger than the reference value T1 at the step 204 on the other hand, the flow goes to the step 206 (S206). The reference value T1 is a value set in advance through experiments and the like. The more the threshold voltage distribution varies from the threshold voltage distribution of the memory cells in the initial state, the more the number of error-corrected bits has the tendency to increase. This fact is found by the inventor et al. Therefore, the number of corrected errors at a likelihood value obtained through a certain likelihood calculation algorithm can be used as the reference to select, among plural likelihood calculation algorithms, a likelihood calculation algorithm for use, thereby obtaining a correct likelihood value that matches the changed threshold voltage distribution, and improving the decoding rate in error correction. As the reference for selection, the reference value T1 as the number of corrected errors is used to determine whether the probability of causing errors is considerably high. Note that, as described above, a likelihood calculation algorithm suitable for the initial state is initially selected to calculate a likelihood value.

At the step 206 (S206), the likelihood calculation algorithm is changed to another. Specifically, the likelihood calculator controller circuit 26 selects a likelihood calculation algorithm different from the pervious likelihood calculation algorithm and transmits an instruction to the likelihood calculator circuit 25 for likelihood calculation with the changed likelihood calculation algorithm.

Next, at the step 208 (S208), the likelihood calculator circuit 25 uses the changed likelihood calculation algorithm to calculate a likelihood value on the ECC frame again and feeds the calculated likelihood value to the ECC circuit 13.

Thereafter, the likelihood value calculated through the changed likelihood calculation algorithm is used in the ECC circuit 13 for error correction. At the same time, the number T of bits corrected in error correction, or the number T of corrected errors, is counted at the corrected-error counter 28 provided in the ECC circuit 13.

Next, at the step 210 (S210), a judgment is made on whether or not the number T of corrected errors counted at the corrected-error counter 28 is smaller than the reference value T1. Specifically, the value of the number T of corrected errors counted at the corrected-error counter 28 is transmitted to the likelihood calculator controller circuit 26.

If the transmitted number T of corrected errors is judged smaller than the reference value T1 at the step 210, the flow goes to the step 212 (S212).

At the step 212 (S212), the likelihood calculator circuit 25 stores information on the changed likelihood calculation algorithm for the later use, and the flow ends.

If the transmitted number T of corrected errors is judged equal to or larger than the reference value T1 at the step 210 on the other hand, the flow goes to the step 214 (S214).

At the step 214 (S214), a judgment is made on whether or not the likelihood calculator circuit 25 still has other likelihood calculation algorithms that have not been used previously.

If it is judged at the step 214 that the likelihood calculator circuit 25 has other likelihood calculation algorithms, the flow jumps to the step 206. At the step 206, the likelihood calculation algorithm is changed again to a different one.

On the other hand, if it is judged at the step 214 that the likelihood calculator circuit 25 has no other likelihood calculation algorithm, the flow goes to the step 216 (S216).

At the step 216 (S216), a refresh operation is executed to the page data at the read address of the frame data. The refresh operation means an operation of writing the page data with a proper threshold voltage level, by reading page data stored at an address in the memory cell array 23 and copying it at another address, for example.

If a memory cell block that is defined as the erase unit has higher correlations between threshold voltage distributions for respective pieces of page data, the refresh operation can be executed on a block basis. After the refresh operation is executed at the step 216, the flow ends.

As described above, in the present embodiment, the number T of errors corrected in error correction is used as the reference to select a likelihood calculation algorithm for calculating a likelihood value based on a threshold distribution that matches the threshold distribution among memory cells. The selected algorithm is then used to calculate a likelihood value. Thus, it is possible to obtain the most reliable likelihood value and improve the error correction ability.

Third Embodiment

A third embodiment is configured such that the number of rewrite operations executed in a memory cell is used as the reference in selection of a likelihood calculation algorithm. Therefore, a rewrite controller circuit 29 is provided as shown in FIG. 9.

Figure 9:
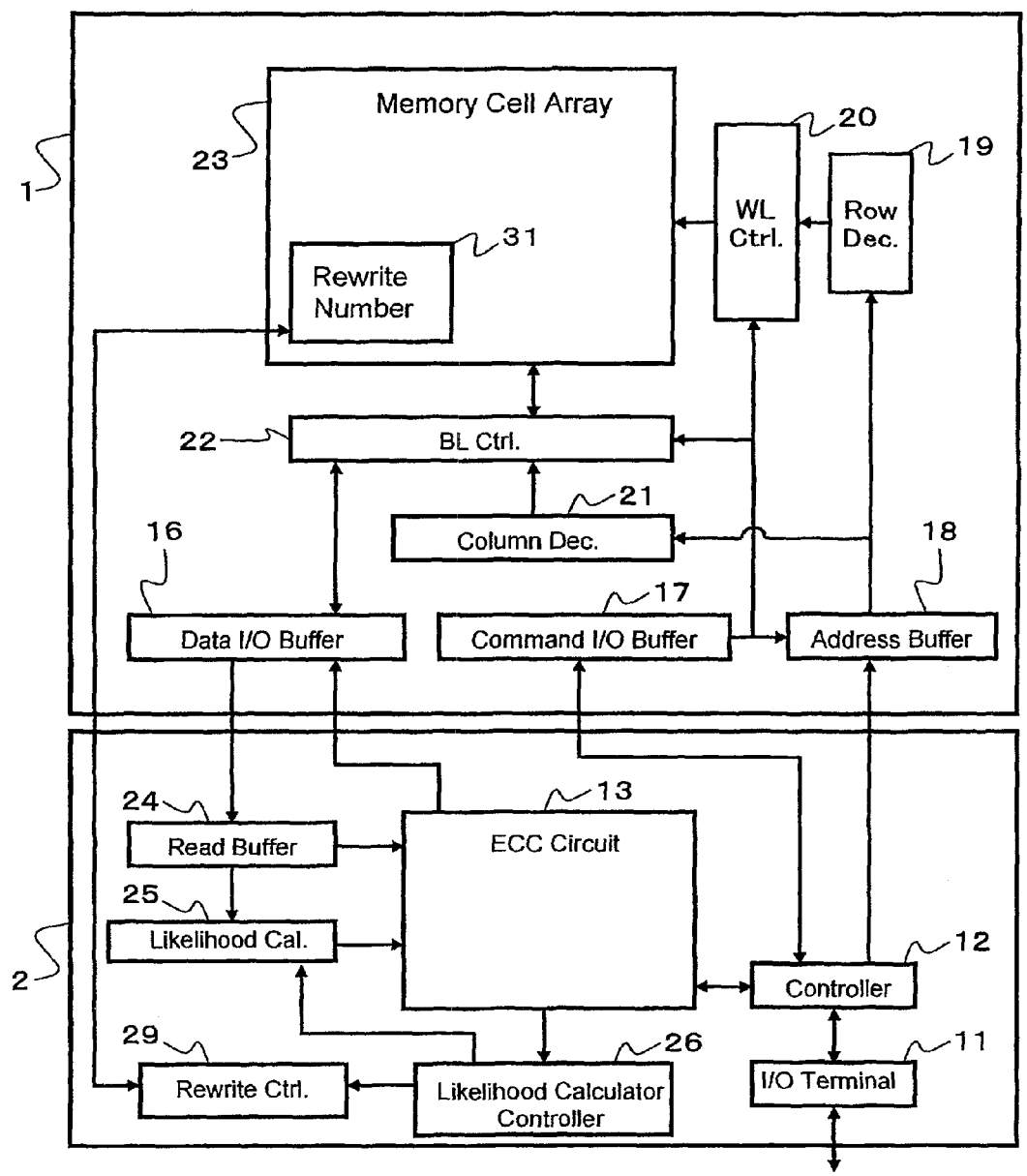
FIG. 9 is a block diagram of a non-volatile semiconductor memory device in a third embodiment.

FIG. 9 is a block diagram of an NAND cell-type flash memory, which is a non-volatile semiconductor memory device in the present embodiment.

The NAND cell-type flash memory in the present embodiment comprises a memory section 1, and a control section 2 for controlling the memory section 1.

The memory section 1 includes a data I/O buffer 16, a command input buffer 17, an address buffer 18, a row decoder 19, a word line controller 20, a column decoder 21, a bit line controller 22, and a memory cell array 23.

The control section 2 includes an I/O terminal 11, a control circuit 12, an error correction unit or ECC circuit 13, a read buffer 24, a likelihood calculator or likelihood calculator circuit 25, a likelihood calculator controller or likelihood calculator controller circuit 26, and a rewrite controller or the rewrite controller circuit 29.

The rewrite controller circuit 29 has a function such that the number of rewrite operations executed in a memory cell at each address in the memory cell array 23 is written in or read from the memory cell array 23. In addition, the number of rewrite operations executed at the read address is transmitted to the likelihood calculator controller circuit 26. The memory cell array 23 includes a rewrite-count storage region 31 formed therein to store the number of rewrite operations executed in a memory cell. The rewrite-count storage region 31 is connected to the rewrite controller circuit 29. The rewrite-count storage region 31 is used to store the number of rewrite operations executed at the address associated with the rewrite-executed memory cell, which is updated at every rewrite operation.

Other functions are similar to those in the first embodiment.

In the present embodiment the number of rewrite operations executed in the read-executed memory cell is used as the reference to change among likelihood calculation algorithms. Namely, as the number of rewrite operations executed in a memory cell increases, the likelihood value obtained with that likelihood calculation algorithm results in a higher probability of causing errors. Based on this finding by the inventor, the likelihood calculation algorithm is changed to another in such the case. Therefore, at every rewrite operation executed in the memory cell array 23, the number of rewrite operations executed in a memory cell at each address is counted at the rewrite controller 29 and stored in a certain region within the memory cell array 23.

The data writing method and others are similar to those in the first embodiment.

A flow of read in the present embodiment is described next based on FIG. 10.

Figure 10:
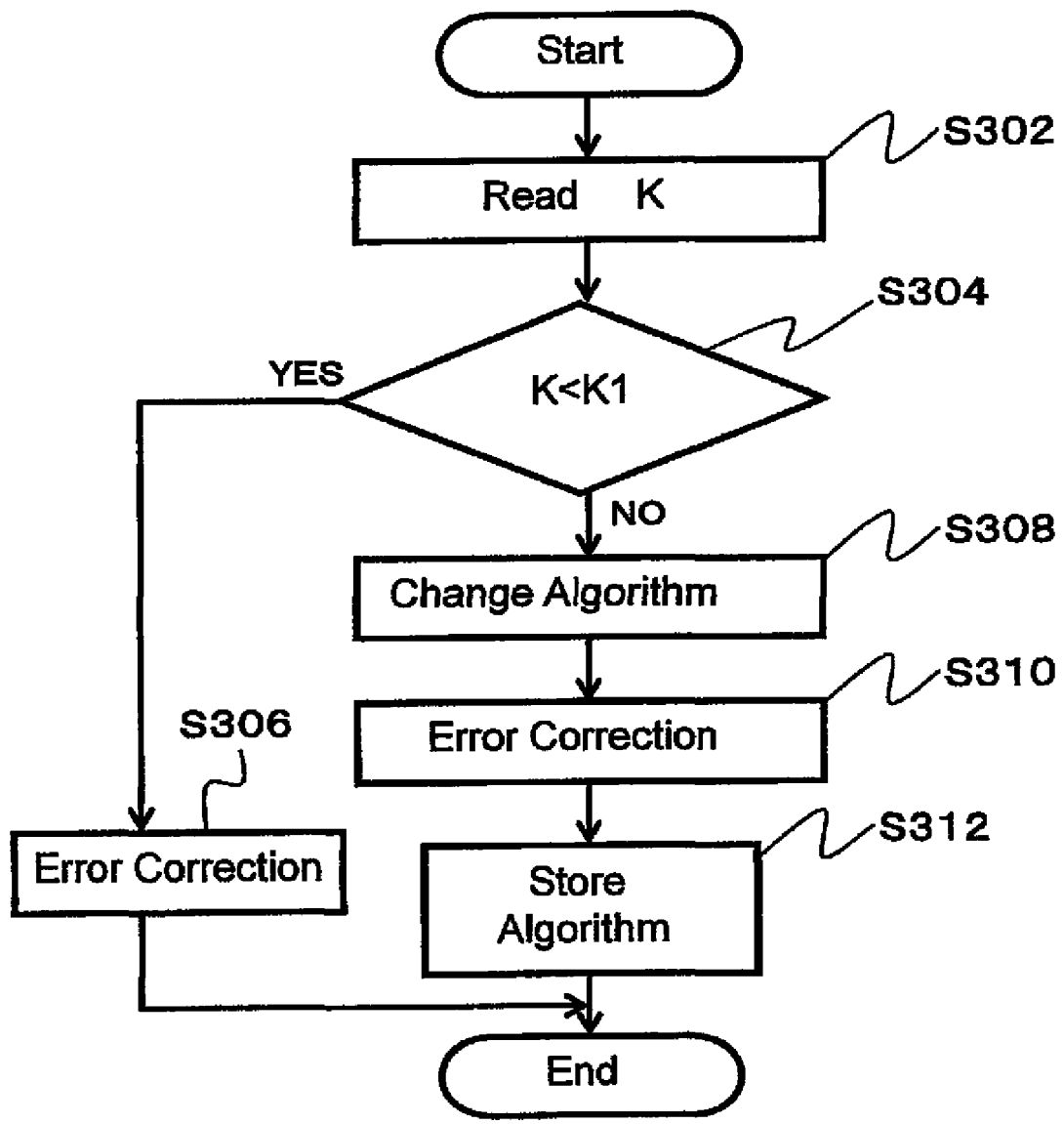
FIG. 10 is a flowchart of operation of the non-volatile semiconductor memory device in the third embodiment.

The flow shown in FIG. 10 starts immediately after data is read out of the memory cell array 23. The read frame data is temporarily stored in the read buffer 25.

First, the number K of rewrite operations executed in the memory cell at the read address is read out of the memory cell array 23 at the step 302 (S302).

Specifically, the number K of rewrite operations executed in the memory cell at the read address is transmitted from the rewrite-count storage region 31 to the rewrite controller circuit 29 and then to the likelihood calculator controller circuit 26.

Next, at the step 304 (S304), a judgment is made in the likelihood calculator controller circuit 26 on whether or not the number K of rewrite operations executed in the memory cell at the read address is smaller than the reference value K1.

If the number K of rewrite operations is judged smaller than the reference value K1 at the step 304, the flow goes to the step 306 (S306).

At the step 306 (S306), the likelihood calculation algorithm initially set in the likelihood calculator circuit 25 is used to calculate a likelihood value. Then, the ECC circuit 13 executes error correction, and the error-corrected data is provided via the control circuit 12 from the I/O terminal 11 to external.

If the number K of rewrite operations is judged equal to or larger than the reference value K1 at the step 304 on the other hand, the flow goes to the step 308 (S308). The reference value K1 is a value set in advance through experiments and the like. The NAND cell-type flash memory has a tendency to increase occurrences of read errors because the more the number of rewrite operations, the more the threshold voltage distribution varies. This fact is found by the inventor et al. Therefore, the number K of rewrite operations executed in the read-executed memory cell can be used as the reference to select, among plural likelihood calculation algorithms, a likelihood calculation algorithm for use, thereby improving the decoding rate in error correction. As a result, the reference value K1 as the number of rewrite operations is used to judge whether the probability of causing errors is considerably high.

At the step 308 (S308), the likelihood calculation algorithm is changed to another. Specifically, the likelihood calculator controller circuit 26 selects a likelihood calculation algorithm different from the pervious likelihood calculation algorithm and transmits an instruction to the likelihood calculator circuit 25 for likelihood calculation with the changed likelihood calculation algorithm.

Next, at the step 310 (S310), the likelihood calculator circuit 25 uses the changed likelihood calculation algorithm to calculate a likelihood value on the ECC frame again and feeds the calculated likelihood value to the ECC circuit 13.

Thereafter, the likelihood value calculated through the changed likelihood calculation algorithm is used in the ECC circuit 13 for error correction.

Thereafter, at the step 312 (S312), the likelihood calculator circuit 25 stores information for the later use of the changed likelihood calculation algorithm, and the flow ends.

As described above, in the present embodiment, the number of rewrite operations executed in the read-executed memory cell is used as the reference to select a likelihood calculation algorithm for calculating a likelihood value based on a threshold distribution that matches the threshold distribution among memory cells. The selected algorithm is then used to calculate a likelihood value. Thus, it is possible to obtain the most reliable likelihood value and improve the error correction ability.

In the present embodiment the number of rewrite operations is used to select among likelihood calculation algorithms though the sum of the number of rewrite operations and the number of erase operations may be counted to select among likelihood calculation algorithms because the deterioration of the oxide also proceeds in erase operations. Alternatively, the period of time elapsed after rewrite may be counted together with the number of rewrite operations to select among likelihood calculation algorithms because the period of time elapsed after rewrite also varies the threshold voltage distribution.

Fourth Embodiment

A fourth embodiment is configured such that an address of a memory cell is used as the reference in selection of a likelihood calculation algorithm.

Figure 11:
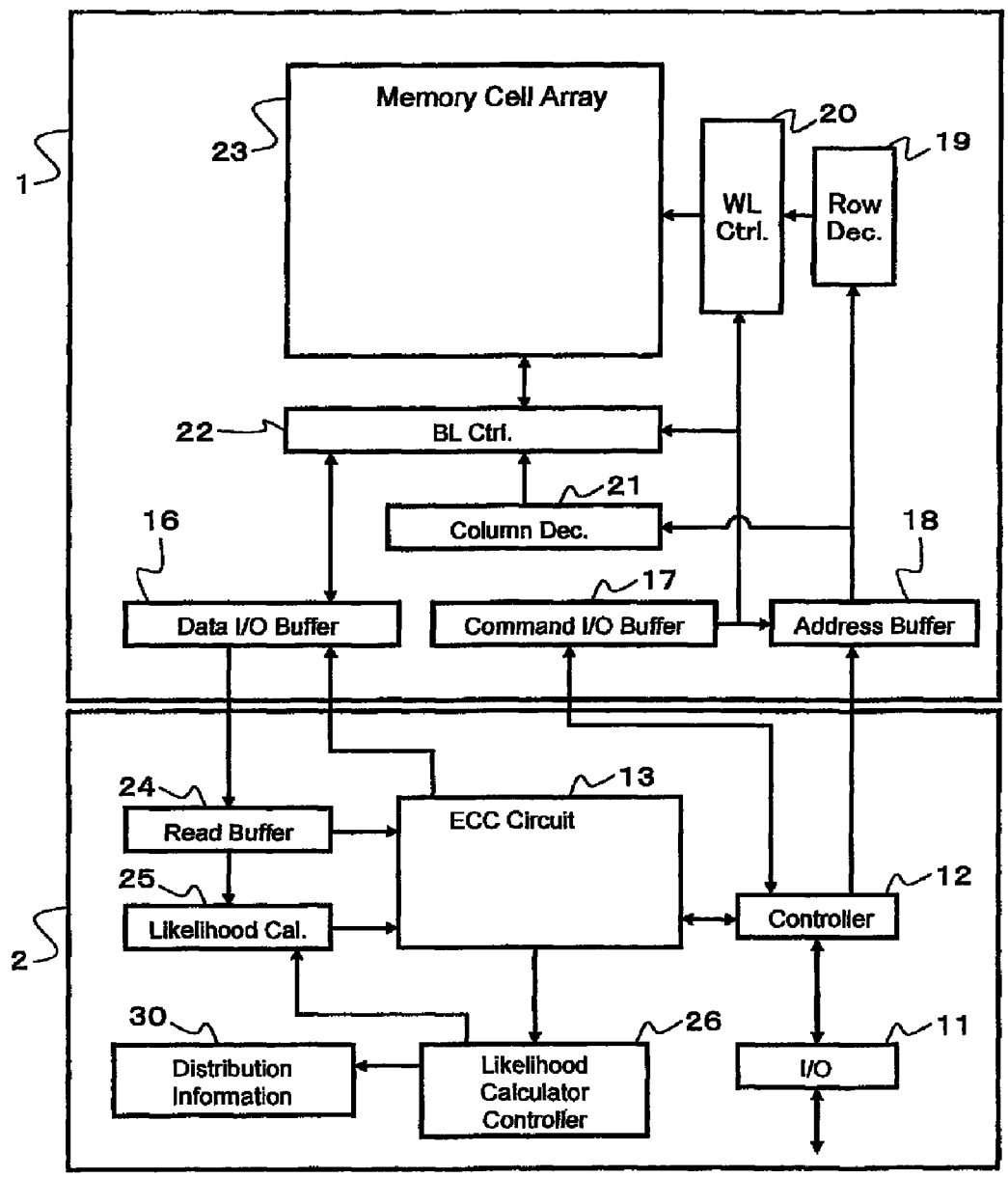
FIG. 11 is a block diagram of a non-volatile semiconductor memory device in a fourth embodiment.

FIG. 11 is a block diagram of an NAND cell-type flash memory, which is a non-volatile semiconductor memory device in the present embodiment.

The NAND cell-type flash memory in the present embodiment comprises a memory section 1, and a control section 2 for controlling the memory section 1.

The memory section 1 includes a data I/O buffer 16, a command input buffer 17, an address buffer 18, a row decoder 19, a word line controller 20, a column decoder 21, a bit line controller 22, and a memory cell array 23.

The control section 2 includes an I/O terminal 11, a control circuit 12, an error correction unit or ECC circuit 13, a read buffer 24, a likelihood calculator or likelihood calculator circuit 25, a likelihood calculator controller or likelihood calculator controller circuit 26, and a memory-cell information storage unit or distribution information storage unit 30.

The distribution information storage unit 30 stores in advance characteristics of memory cells in the memory cell array 23 concerning the threshold voltage distribution on an address basis. In the NAND cell-type flash memory and the like, the memory cells have different characteristics even in the same memory cell array 1 due to exposure variations and production variations. Therefore, the device measures the characteristics of memory cells in the memory cell array 23 concerning the threshold voltage distribution in advance, stores this information in the distribution information storage unit 30 and, based on the information in the distribution information storage unit 30, selects among likelihood calculation algorithms.

The data writing method and others are similar to those in the first embodiment.

A flow of read in the present embodiment is described next based on FIG. 12.

Figure 12:
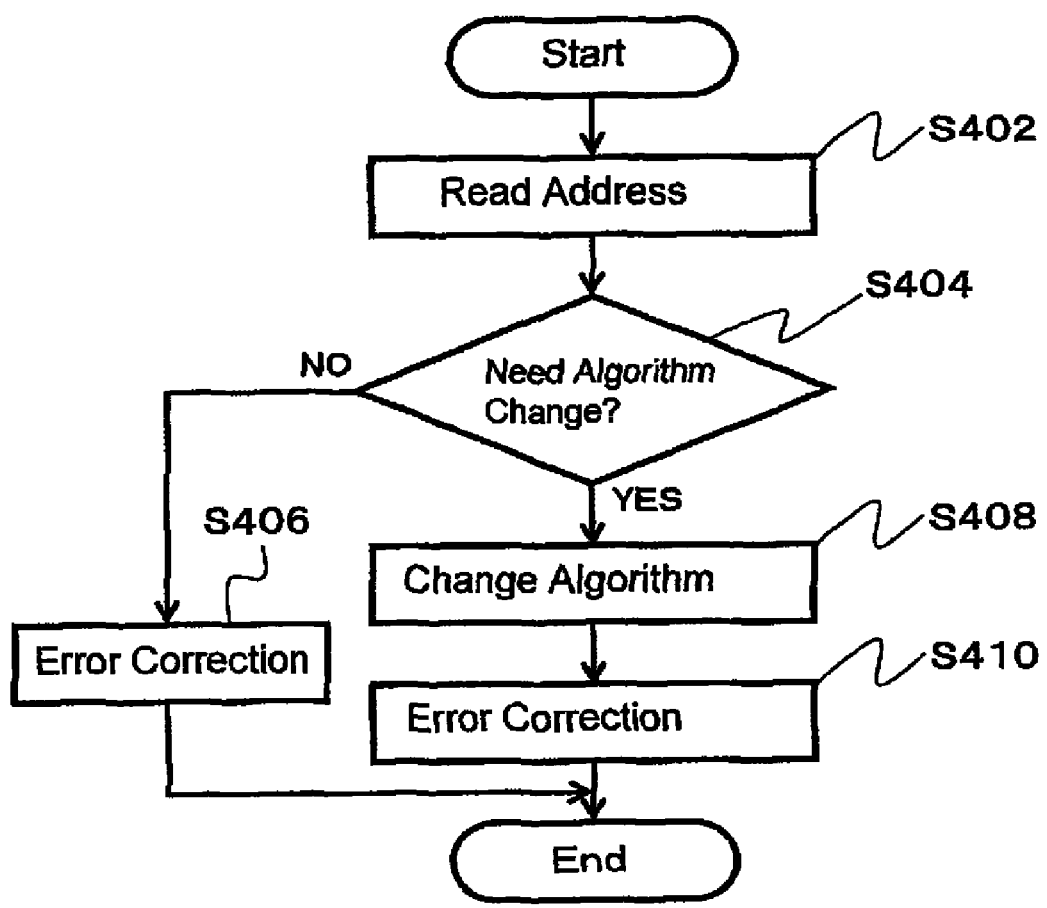
FIG. 12 is a flowchart of operation of the non-volatile semiconductor memory device in the fourth embodiment.

The flow shown in FIG. 12 starts immediately after data is read out of the memory cell array 23. The read frame data is temporarily stored in the read buffer 24.

First, the information in the memory cell at the read address is read out of the memory cell array 23 at the step 402 (S402). Specifically, the information at the address associated with the read-executed memory cell is read from the distribution information storage unit 30 and transmitted to the likelihood calculator controller circuit 26.

Next, at the step 404 (S404), based on the information at the read address, a judgment is made in the likelihood calculator controller circuit 26 on whether or not there is a need for changing the initially set likelihood calculation algorithm.

If it is determined at the step 404 (S404) that there is no need for changing the initially set likelihood calculation algorithm, the flow goes to the step 406 (S406).

At the step 406 (S406), the likelihood calculation algorithm initially set in the likelihood calculator circuit 25 is used to calculate a likelihood value. Then, the ECC circuit 13 executes error correction, and the error-corrected data is provided via the control circuit 12 from the I/O terminal 11 to external.

If it is determined at the step 404 (S404) that there is a need for changing the initially set likelihood calculation algorithm, the flow goes to the step 408 (S408).

At the step 408 (S408), the likelihood calculation algorithm is changed to another. Specifically, the likelihood calculator controller circuit 26 selects a likelihood calculation algorithm different from the pervious likelihood calculation algorithm and transmits an instruction to the likelihood calculator circuit 25 for likelihood calculation with the changed likelihood calculation algorithm.

Next, at the step 410 (S410), the likelihood calculator circuit 25 uses the changed likelihood calculation algorithm to calculate a likelihood value on the ECC frame again and feeds the calculated likelihood value to the ECC circuit 13.

Thereafter, the likelihood value calculated through the changed likelihood calculation algorithm is used in the ECC circuit 13 for error correction.

As described above, in the present embodiment, the production variation in the read-executed memory cell, for example, is used as the reference to select a likelihood calculation algorithm for calculating a likelihood value based on a threshold distribution that matches the threshold distribution among memory cells. The selected algorithm is then used to calculate a likelihood value. Thus, it is possible to obtain the most reliable likelihood value and improve the error correction ability.

Fifth Embodiment

A fifth embodiment is configured such that a quantized value of the threshold voltage read from a pilot memory cell is used as the reference in selection of a likelihood calculation algorithm.

Figure 13:
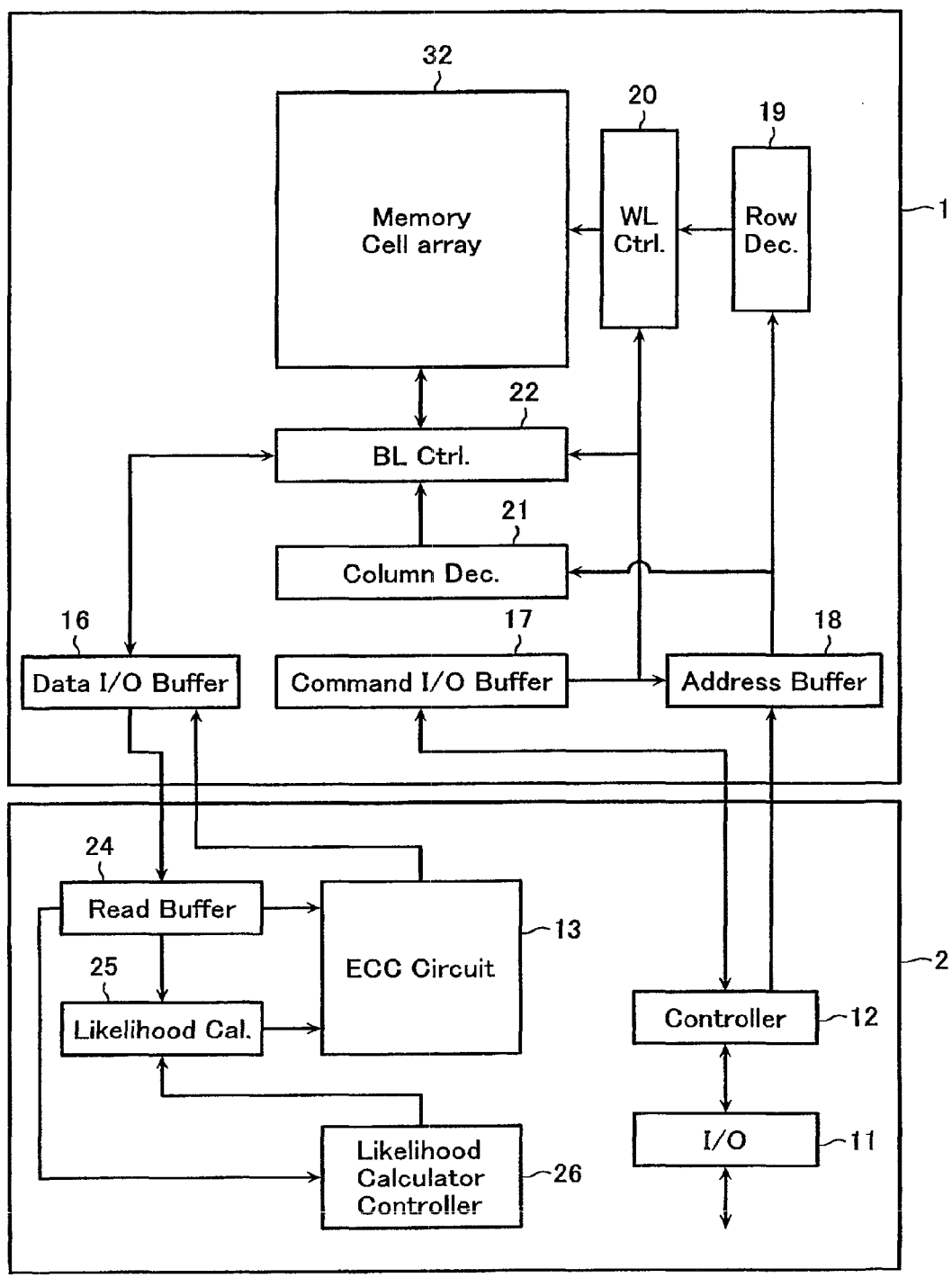
FIG. 13 is a block diagram of a non-volatile semiconductor memory device in a fifth embodiment.

FIG. 13 is a block diagram of an NAND cell-type flash memory, which is a non-volatile semiconductor memory device in the present embodiment.

The NAND cell-type flash memory in the present embodiment comprises a memory section 1, and a control section 2 for controlling the memory section 1.

The memory section 1 includes a data I/O buffer 16, a command input buffer 17, an address buffer 18, a row decoder 19, a word line controller 20, a column decoder 21, a bit line controller 22, and a memory cell array 32.

The control section 2 includes an I/O terminal 11, a control circuit 12, an error correction unit or ECC circuit 13, a read buffer 24, a likelihood calculator or likelihood calculator circuit 25, and a likelihood calculator controller or likelihood calculator controller circuit 26. The memory cell array 32 includes pilot memory cells PMC1 and PMC2 each with a threshold voltage value to be programmed in advance.

Figure 14:
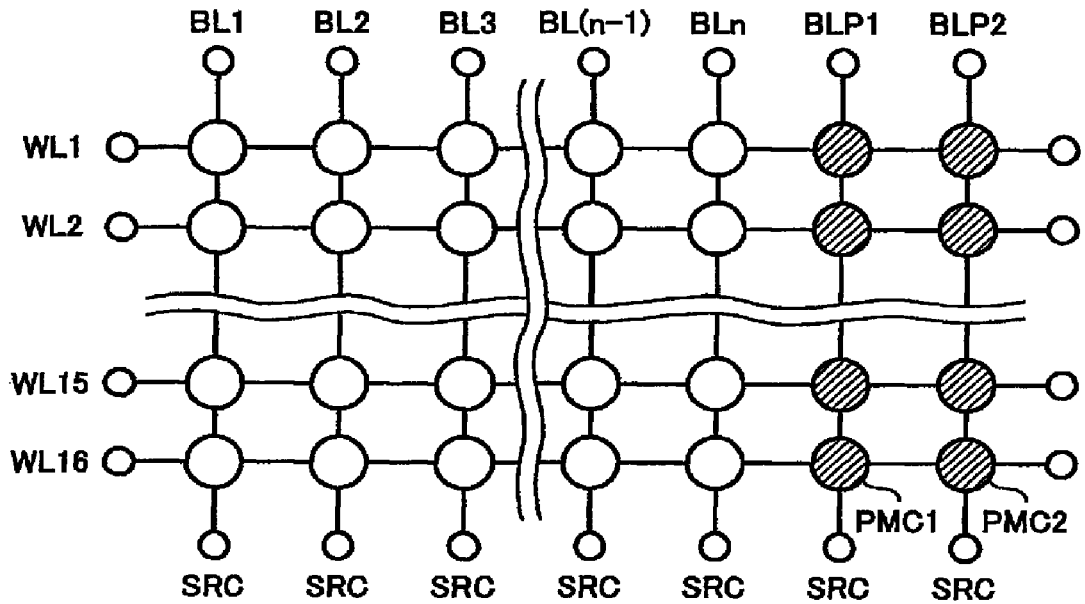
FIG. 14 shows a configuration of pilot memory cells included in the memory cell array 32 shown in FIG. 13.

The configuration of the memory cell array 32 is shown in FIG. 14. As shown in FIG. 14, "n" memory cells (corresponding to a page size) and two pilot memory cells PMC1, PMC2 are arranged per row address (along one word line WLi). The "n" memory cells are arranged along bit lines BL1-BLn, respectively. The pilot memory cells PMC1 and PMC2 are arranged along bit lines BLP1 and BLP2, respectively.

Although it is assumed here that the two pilot memory cells are arranged therein for simplified explanation, the number of the pilot memory cells may be changed if necessary. Moreover, the number of multiple-valued levels stored in one memory cell in the memory cell array 32 may be set at any number.

The description hereinbelow explains 4-value memory cell as an example, which stores 2-bit information per memory cell.

Figure 15A:
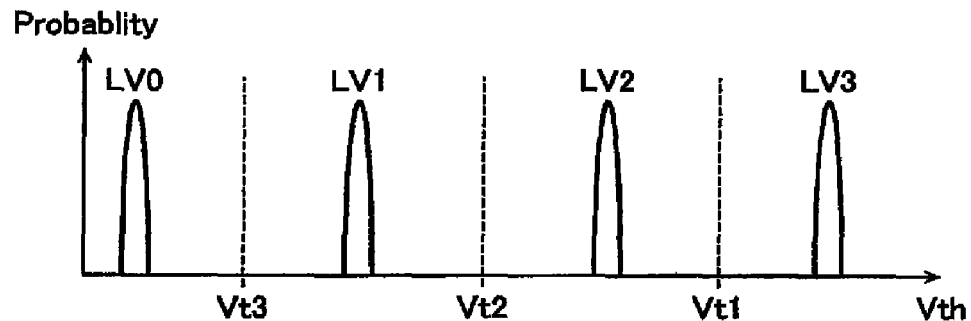
FIG. 15A, FIG. 15B and FIG. 15C each shows distributions of the threshold voltage of the memory cells.
Figure 15B:
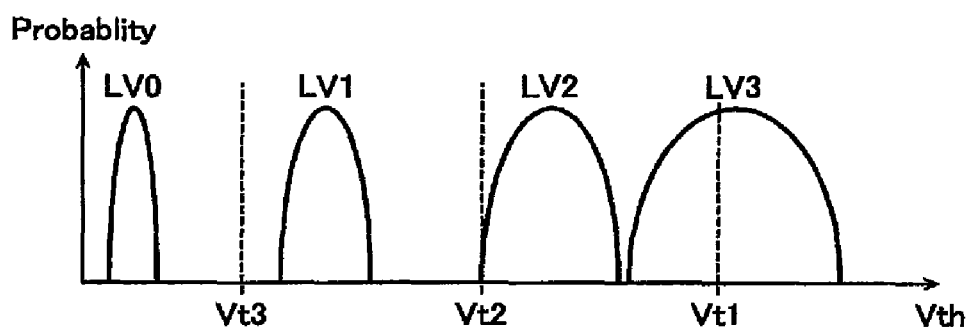
Figure 15C:
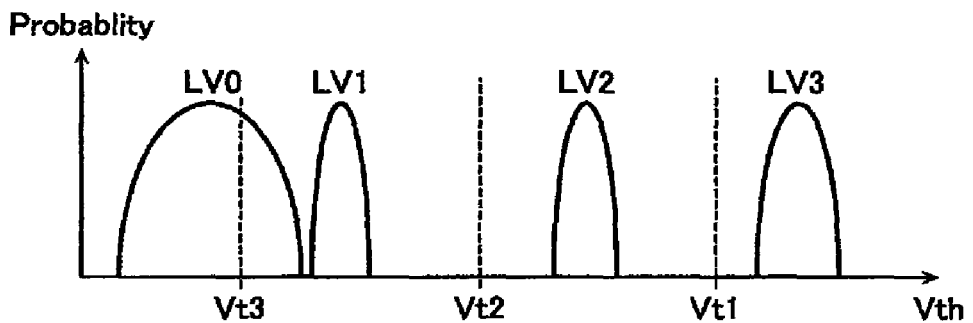

In general, threshold voltage distributions varies, as shown in FIG. 15A, FIG. 15B, and FIG. 15C. FIG. 15A shows a distribution immediately after a data write. FIG. 15B shows a distribution after a long time elapsed after a data write. FIG. 15C shows a distribution after an excessive reading.

FIG. 15A illustrates a threshold voltage distribution just after a data write. 4-value memory cell has four threshold voltage levels, as shown in FIG. 15A.

As shown in FIG. 15A, threshold voltage distributions LV0, LV1, LV2, and LV3 of the four levels immediately after a data write are separated with sufficient intervals therebetween. Accordingly, data may be determined using read voltages Vt1, Vt2, and Vt3, and each level may be detected easily.

FIG. 15B expresses the threshold voltage distribution after a long time elapsed after a data write. Because of the elapsed time, a threshold voltage level will fall in the memory cell to which high threshold voltage level is given. Therefore, as shown in FIG. 15B, the threshold voltage distributions LV2 and LV3 are widened to have a larger width, and fall to a low level as a whole. For this reason, a read error occurs in the condition shown in FIG. 15B, although the memory cell with the threshold voltage distribution LV3 and LV2 may be read accurately by read voltages Vt1 and Vt2 in FIG. 15A. Moreover, the likelihood value calculated based on the threshold voltage distribution shown in FIG. 15A is not an exact likelihood value for memory cells with the threshold voltage distribution shown in FIG. 15B.

On the other hand, FIG. 15C shows a case where a memory cell received a stress by excessive reading and the threshold voltage of the memory cell with a threshold voltage distribution LV0 has risen. In a threshold distribution of voltage as shown in FIG. 15C, a read error between the threshold voltage distributions LV0 and LV1 occurs frequently. For this reason, each memory cell in the memory cell array 32 has either one of the threshold voltage distributions shown in FIGS. 15A-C according to the status of data write, data read. Therefore, it is necessary to select a proper likelihood computation algorithm for every address. In this embodiment, a selection of the likelihood computation algorithm is performed using a pilot memory cell.

Figure 16A:
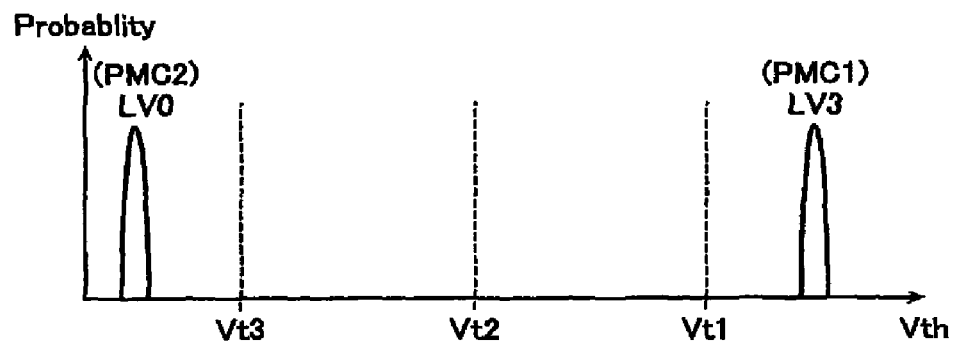
FIG. 16A, FIG. 16B and FIG. 16C each shows a threshold voltage distribution of the pilot memory cells.

Specifically, at the time of data write, the data of the threshold voltage distribution LV3 is written in the pilot memory cell PMC1 corresponding to the row address selected for data write. The data of the threshold distribution voltage LV0 is written in the pilot memory cell PMC2. Then, the threshold voltage distributions of the pilot memory cell PMC1 and PMC2 immediately after data write becomes as shown in FIG. 16A.

Figure 16B:
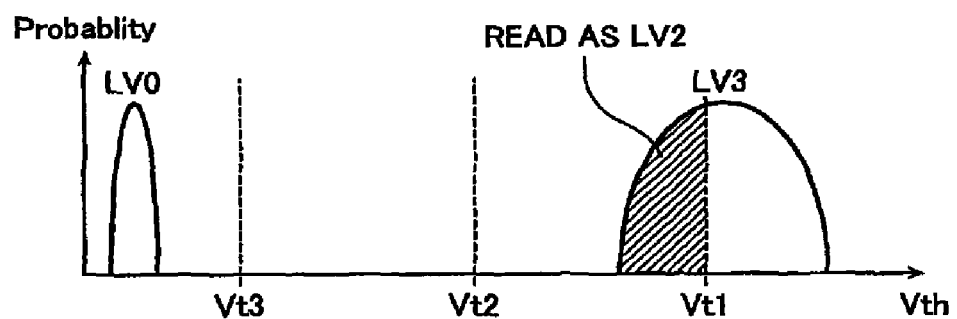

When a long time elapses after data write, the threshold voltage distribution of the pilot memory cell PMC1 and PMC2 turns into a distribution as shown in FIG. 16B. In this case, the pilot memory cell PMC1 is likely to have a read error. Specifically, it is mistakenly read as having a threshold voltage distribution LV2, not LV3.

Figure 16C:
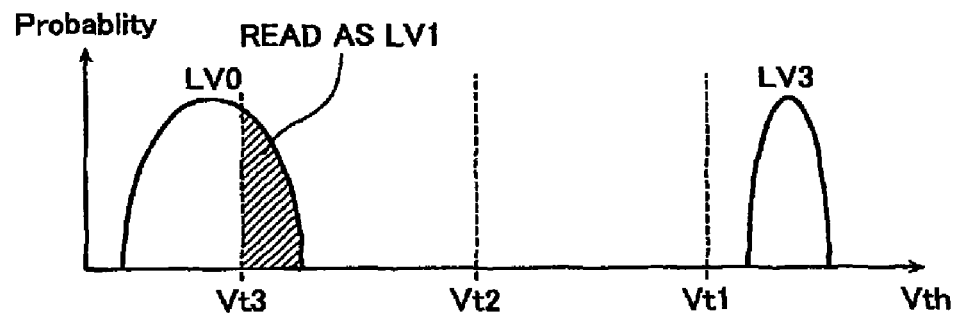

In the address after an excessive reading, the threshold voltage distribution of the pilot memory cells PMC1 and PMC2 becomes as shown in FIG. 16C. In this case, the probability that the pilot memory cell PMC2 is read mistakenly as LV1, not LV0 becomes high.

Therefore, when it is judged that the pilot memory cells PMC1 and PMC2 have threshold voltage distributions LV3 and LV0, respectively, the algorithm A for calculating a likelihood value based on the threshold voltage distribution shown in FIG. 15A is selected.

On the other hand, when it is judged that the pilot memory cell PMC1 and PMC2 have threshold voltage distributions LV2 and LV0, respectively, the algorithm B for calculating a likelihood value based on the threshold voltage distribution shown in FIG. 15B is selected.

Moreover, when it is judged that the pilot memory cells PMC1 and PMC2 have threshold voltage distributions LV3 and LV1, respectively, the algorithm C for calculating a likelihood value based on the threshold voltage distribution shown in FIG. 15C is selected. Thereby, it becomes possible to calculate an accurate likelihood value corresponding to the threshold voltage distribution for every address. The method of data write is the same as that of the first embodiment.

Figure 17:
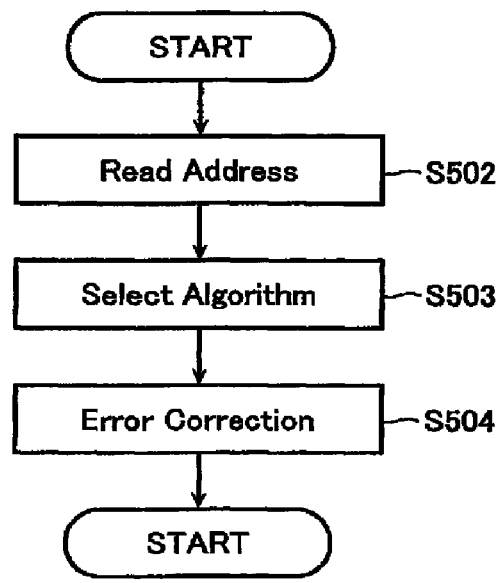
FIG. 17 is a flowchart of operation of the non-volatile semiconductor memory device in the fifth embodiment.

A flow of read in the present embodiment is described next based on FIG. 17. The flow shown in FIG. 17 starts immediately after data is read out of the memory cell array 32. The read frame data is temporarily stored in the read buffer 24.

First, a quantized value of the threshold voltage of the pilot memory cell at the read address is read from the memory cell array 32 at the step 502 (S502). Specifically, the threshold voltage distribution inferred from the level of the quantized value of the threshold voltage is transmitted to the likelihood calculator controller circuit 26.

Next, at the step 503 (S503), the likelihood calculator controller circuit 26 selects a proper likelihood calculation algorithm based in the threshold voltage distribution inferred, and the algorithm is transmitted to the likelihood calculation circuit 25. Then, the likelihood calculation circuit 25 calculates likelihood values using the likelihood calculation algorithm selected. The ECC circuit 13 performs error correction, ant the flow ends.

As described above, in the present embodiment, a threshold voltage distribution of a memory cell at each address may be inferred based on a quantized value of the threshold voltage read from the pilot memory cells, thereby selecting a likelihood calculation algorithm calculating accurate likelihood values. As a result, it is possible to obtain the most reliable likelihood value and improve the error correction ability.

The present invention is not limited to the above embodiments but rather can be variously embodied in practical stages by modifying the components without departing from the scope and spirit thereof. All the components disclosed in the above embodiments can be combined appropriately to form various inventions. For example, some components may be deleted from all the components disclosed in the above embodiments. Further, the components disclosed over different embodiments may be added/combined appropriately.

What is claimed is:

1. A non-volatile semiconductor memory device, comprising:
    a memory cell array comprising a plurality of memory cells arrayed capable of storing information in accordance with variations in threshold voltage; and
    a control section comprising a likelihood calculator and an error correction unit, the control section being configured to perform error correction processing for correcting an error of a data bit read out of the memory cell, wherein in the error correction processing:
    the likelihood calculator is configured to derive, with a first likelihood calculation algorithm, a first likelihood value about the data bit;
    the error correction unit is configured to perform first iterative processing with the first likelihood value;
    the likelihood calculator is configured to derive, with a second likelihood calculation algorithm, a second likelihood value about the data bit about which the first likelihood value has been derived; and
    the error correction unit is configured to perform a second iterative processing with the second likelihood value.

2. The non-volatile semiconductor memory device according to claim 1, wherein the error correction unit comprises a counter operative to measure the number of iterations in the iterative processing.

3. The non-volatile semiconductor memory device according to claim 2, wherein the likelihood calculator calculates the first and second likelihood values with a plurality of read voltages applied to the memory cell.

4. The non-volatile semiconductor memory device according to claim 2, wherein if the number of iterations in the second iterative processing exceeds a certain value, a refresh operation is applied to the memory cell.

5. The non-volatile semiconductor memory device according to claim 2, wherein if the number of iterations in the second iterative processing is less than a certain value, the likelihood calculator stores the second likelihood calculation algorithm.

6. The non-volatile semiconductor memory device according to claim 1, wherein threshold voltage distributions for each of the first and second likelihood calculation algorithms are different.

7. The non-volatile semiconductor memory device according to claim 1, wherein the likelihood calculator calculates the first and second likelihood values with a plurality of read voltages applied to the memory cell.

8. The non-volatile semiconductor memory device according to claim 7, wherein if the number of iterations in the second iterative processing exceeds a certain value, a refresh operation is applied to the memory cell.

9. The non-volatile semiconductor memory device according to claim 7, wherein if the number of iterations in the second iterative processing is less than a certain value, the likelihood calculator stores the second likelihood calculation algorithm.

10. The non-volatile semiconductor memory device according to claim 7, wherein threshold voltage distributions for each of the first and second likelihood calculation algorithms are different.

11. The non-volatile semiconductor memory device according to claim 1, wherein if the number of iterations in the second iterative processing exceeds a certain value, a refresh operation is applied to the memory cell.

12. The non-volatile semiconductor memory device according to claim 11, wherein the likelihood calculator calculates the first and second likelihood values with a plurality of read voltages applied to the memory cell.

13. The non-volatile semiconductor memory device according to claim 11, wherein if the number of iterations in the second iterative processing is less than a certain value, the likelihood calculator stores the second likelihood calculation algorithm.

14. The non-volatile semiconductor memory device according to claim 1, wherein if the number of iterations in the second iterative processing is less than a certain value, the likelihood calculator stores the second likelihood calculation algorithm.

15. The non-volatile semiconductor memory device according to claim 14, wherein the likelihood calculator calculates the first and second likelihood values with a plurality of read voltages applied to the memory cell.

16. The non-volatile semiconductor memory device according to claim 14, wherein if the number of iterations in the second iterative processing exceeds a certain value, a refresh operation is applied to the memory cell.

17. The non-volatile semiconductor memory device according to claim 1, wherein threshold voltage distributions for each of the first and second likelihood calculation algorithms are different.

18. The non-volatile semiconductor memory device according to claim 17, wherein the likelihood calculator calculates the first and second likelihood values with a plurality of read voltages applied to the memory cell.

19. The non-volatile semiconductor memory device according to claim 17, wherein if the number of iterations in the second iterative processing exceeds a certain value, a refresh operation is applied to the memory cell.

20. The non-volatile semiconductor memory device according to claim 17, wherein if the number of iterations in the second iterative processing is less than a certain value, the likelihood calculator stores the second likelihood calculation algorithm.

* * * * *